United States Patent
Lien et al.

(10) Patent No.: US 12,162,749 B2
(45) Date of Patent: *Dec. 10, 2024

(54) BOND WAVE OPTIMIZATION METHOD AND DEVICE

(71) Applicant: Taiwan Semiconductor Manufacturing Company LTD, Hsinchu (TW)

(72) Inventors: Kang-Yi Lien, Tainan (TW); I-Hsuan Chiu, Taipei (TW); Yi-Chieh Huang, Tainan (TW); Chia-Ming Hung, Taipei (TW); Kuan-Chi Tsai, Kaohsiung (TW); Hsiang-Fu Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,904

(22) Filed: Aug. 9, 2023

(65) Prior Publication Data

US 2023/0382723 A1 Nov. 30, 2023

Related U.S. Application Data

(63) Continuation of application No. 17/670,955, filed on Feb. 14, 2022, now Pat. No. 11,834,332.

(60) Provisional application No. 63/230,277, filed on Aug. 6, 2021.

(51) Int. Cl.
*B81C 1/00* (2006.01)
*B81B 7/00* (2006.01)

(52) U.S. Cl.
CPC ........ *B81C 1/00333* (2013.01); *B81B 7/0077* (2013.01)

(58) Field of Classification Search
None
See application file for complete search history.

(56) References Cited

U.S. PATENT DOCUMENTS 11,834,332 B2 * 12/2023 Lien .................... B81C 1/00269

* cited by examiner

*Primary Examiner* — Michael Lebentritt
(74) *Attorney, Agent, or Firm* — Lippes Mathias LLP

(57) ABSTRACT

A semiconductor device and method of manufacturing the device that includes a growth die and a dummy die. The method includes patterning, on an integrated circuit wafer, at one least growth die, and patterning at least one dummy die that is positioned on at least a portion of a circumference of the integrated circuit wafer. The patterned growth and dummy dies are etched on the wafer. A bond wave is initiated at a starting point on the integrated circuit wafer. The starting point is positioned on an edge of the integrated circuit wafer opposite the portion on which the at least one dummy die is patterned. Upon application of pressure at the starting point, a uniform bond wave propagates across the wafers, bonding the two wafers together.

20 Claims, 15 Drawing Sheets

BOND WAVE OPTIMIZATION METHOD AND DEVICE

PRIORITY CLAIM AND CROSS-REFERENCE

This application is a continuation of U.S. patent application Ser. No. 17/670,955, filed Feb. 14, 2022 and titled BOND WAVE OPTIMIZATION METHOD AND DEVICE, which claims the benefit of U.S. Provisional Application Ser. No. 63/230,277 filed Aug. 6, 2021 and titled BOND WAVE OPTIMIZATION METHODOLOGY BY DUMMY BOTTOM RETICLE FIELD, the disclosures of which are incorporated herein by reference in their entirety.

BACKGROUND

In wafer-to-wafer bonding technology, various methods have been developed to bond two package components (such as wafers) together. Some wafer bonding methods include fusion bonding (also known as direct bonding), which is a process for joining surfaces together without intermediate layers. The process is based on the formation of chemical bonds between the surfaces when the surfaces are sufficiently flat, clean, and smooth. Joining of the surfaces begins at one end of the wafers and propagates forward in a bonding wave toward the opposite end during the fusion bonding process. Micro-electro-mechanical systems (MEMS) is a technology that employs miniature mechanical and electro-mechanical elements (e.g., devices or structures) on an integrated chip. Utilizing micro-fabrication techniques, MEMS devices may range from relatively simple structures with no moving elements, to complex electromechanical systems utilizing a variety of moving elements under the control of an integrated microelectronic controller. Devices or structures that can be used in MEMS include microsensors, micro-actuators, microelectronics, and microstructures. MEMS devices may be used in a wide range of applications, including, for example and without limitation, motion sensors, pressure sensors, inertial sensors, microfluidic devices (e.g., valves, pumps, nozzle controls), optical devices, imaging devices (e.g., micromachined ultrasonic transducers ("MUT"s)), capacitive MUT ("CMUT") ultrasound transducers, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
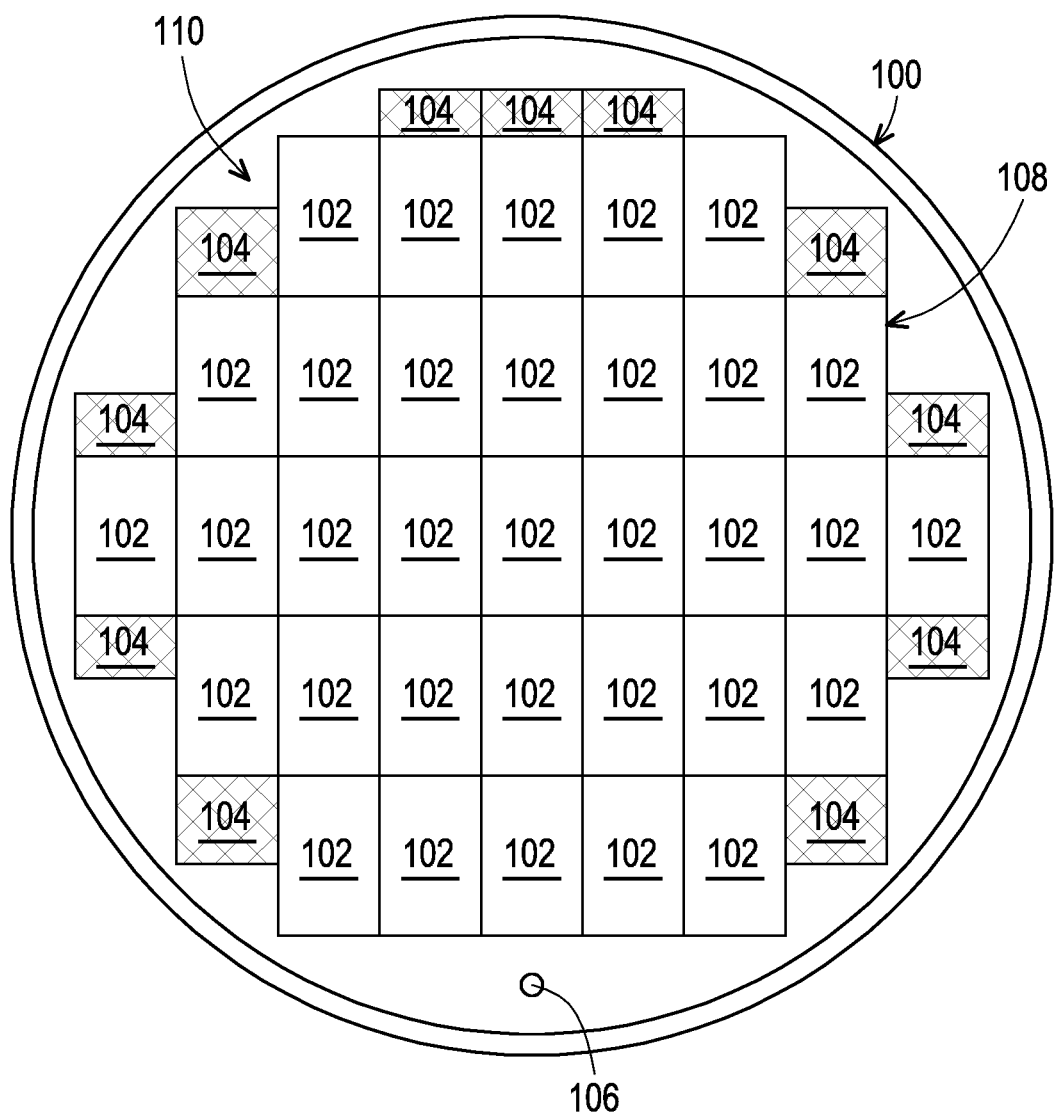
FIG. 1 illustrates a top view of a semiconductor wafer depicting growth dies and dummy dies in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

In some embodiments, a semiconductor device (e.g., integrated chip) comprises a microelectromechanical systems (MEMS) device. The MEMS device comprises a cavity and a movable membrane. The configuration (e.g., structural configuration) of the MEMS device is dependent on the type of MEMS device. The present disclosure discusses structures and fabrication methods of a capacitive MUT (CMUT). However, the skilled artisan will appreciate that such discussion is exemplary in nature, and the methods and structures described herein are capable of implementation for a variety of other types of MEMS devices.

In particular, the present disclosure alleviates voids that form between two wafers during a fusion bonding process. That is, during fusion bonding, the bond wave propagates from one side of the wafers being joined to the opposite side. As this bond wave moves, the original wafer pattern may induce a non-uniform bond wave. This non-uniformity can generate bubbles and trap voids during the fusion bonding process and during subsequent annealing processing. These trap voids cause weak bond strength between the wafers and present a peeling risk in any subsequent processing. Embodiments disclosed herein employ dummy or non-functional patterns (i.e. dies) positioned partially around the circumference of a wafer to reduce the total bond area (i.e. the ratio of the bonding surface of the wafer to the total surface area of the wafer). Various embodiments presented herein utilize dummy or non-functional patterns that include cavities to achieve this reduction in total bond area. Usage of such dummy or non-functional patterns to reduce the total bond area facilitates the prevention of bubbles and trap voids during the wafer-to-wafer bonding process. Furthermore, such dummy or non-function patterns optimize bond wave velocity and route (wafer center/edge), resulting in a substantially even wave travel across the wafers.

Turning now to FIG. 1, there is shown a bottom, or integrated circuit wafer 100 in accordance with one embodiment of the present disclosure. The various component of the integrated circuit wafer 100 are illustrated in greater detail below with respect to FIGS. 3A-3G. As shown in FIG. 1, the integrated circuit wafer 100 includes a plurality of effective dies 102 disposed on the wafer 100. It will be appreciated the number of effective, or growth, dies 102 may be dependent on the size (i.e. diameter) of the wafer 100, the size (i.e. area) of the die 102 (e.g. patterned semiconductor device, MEMS device, etc.), and the like. The number of growth dies 102 in FIG. 1 is therefore intended as a non-limiting example. The integrated circuit wafer 100 includes a plurality of non-effective, non-functional, or "dummy" dies 104 that are located along a portion of the edge of the wafer 100. As shown in FIG. 1, one portion of the wafer edge 100 located in proximity to a starting point 106 (of the bond wave generated during the aforementioned fusion bonding processing) does not include dummy dies 104. In some embodiments, the growth dies 102 are located in a growth die area 108 on the surface 110 of the wafer 100, i.e., the effective or usable area of the wafer 108 in accordance with the size of the growth dies 102, while the dummy dies 104 are positioned outside this growth die or usable area 108 on the surface 110 of the wafer 100.

The non-effective, non-functional, or dummy dies 104 shown in FIG. 1 may include the same patterning as the growth dies 102 (i.e. functional dies), inclusive of the various components (as illustrated in FIGS. 3A-3F below), or may utilize only cavities with no underlying, i.e. functioning components patterned therein. The pattern of the dummy dies 104 may thus vary from the growth dies 102, in accordance with varying design and fabrication considerations. Accordingly, in some embodiments, the dummy dies 104 are different in patterning from the growth dies 102. In accordance with varying embodiments disclosed herein, the number of dummy dies 104 patterned on the wafer 100 may be determined in accordance with a desired bond area of the wafer 100, for example and without limitation, the number of dummy dies 104 may increase or decrease to provide a wafer-to-wafer bond area in the range of 55% to 65% of the total wafer surface area. In some embodiments, the total area of the cavities in the growth dies 102 and the dummy dies 104 is in the range of 35% to 45% of the total surface area of the integrated circuit wafer 100. In accordance with some embodiments, each growth die 102 includes a bonding surface between individual CMUT units, as illustrated in FIG. 2A.

Figure 2A:
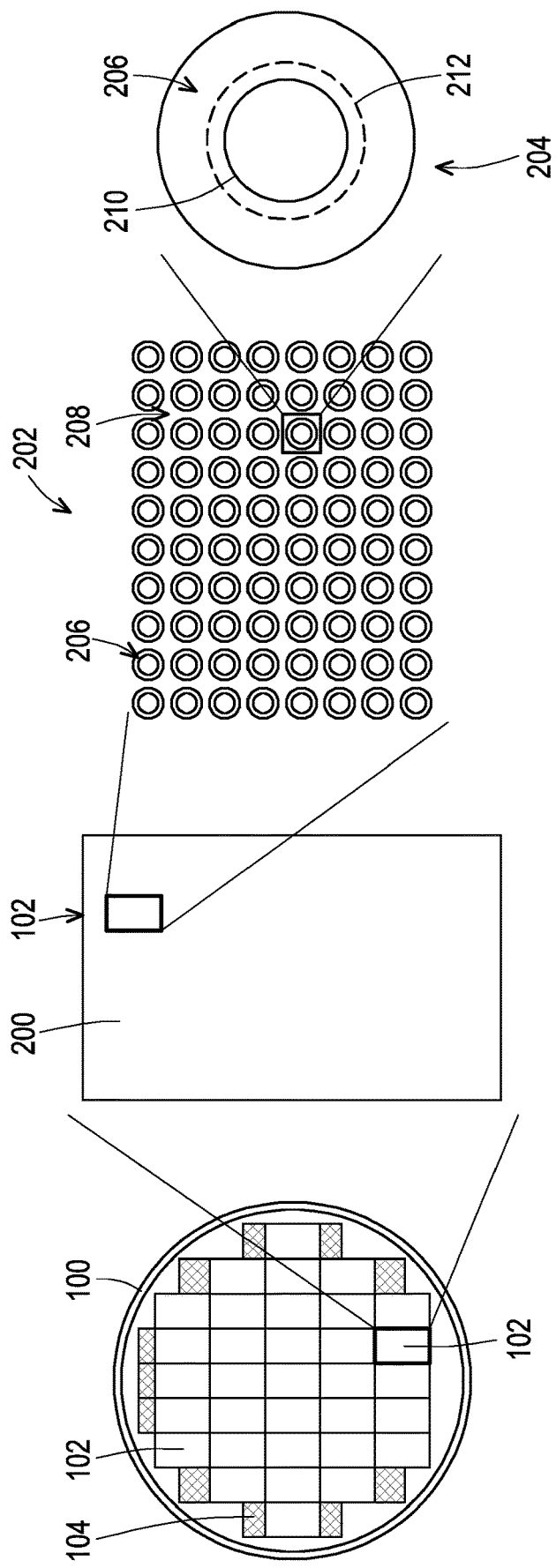
FIG. 2A illustrates a CMUT array of a growth die of FIG. 1.

FIG. 2A illustrates one exemplary growth die 102 corresponding to, for example, a CMUT array 200 that may be patterned on the wafer 100 in accordance with one embodiment. As shown in FIG. 2A, the CMUT array 200 of the growth die 102 includes a cavity array 202 that comprises a plurality of CMUT units 204. For illustrative purposes, each cavity 206 of each CMUT unit 204 is depicted in FIG. 2A, along with a designation of the bonding surface 208 representative of the portion of the wafer 100 to be bonded in accordance with one embodiment. FIG. 2A further provides an illustration of a CMUT unit 204 in accordance with one embodiment, wherein the cavity 206 is readily visible surrounding a bottom electrode 210 and associated movable membrane 212.

Figure 2B:
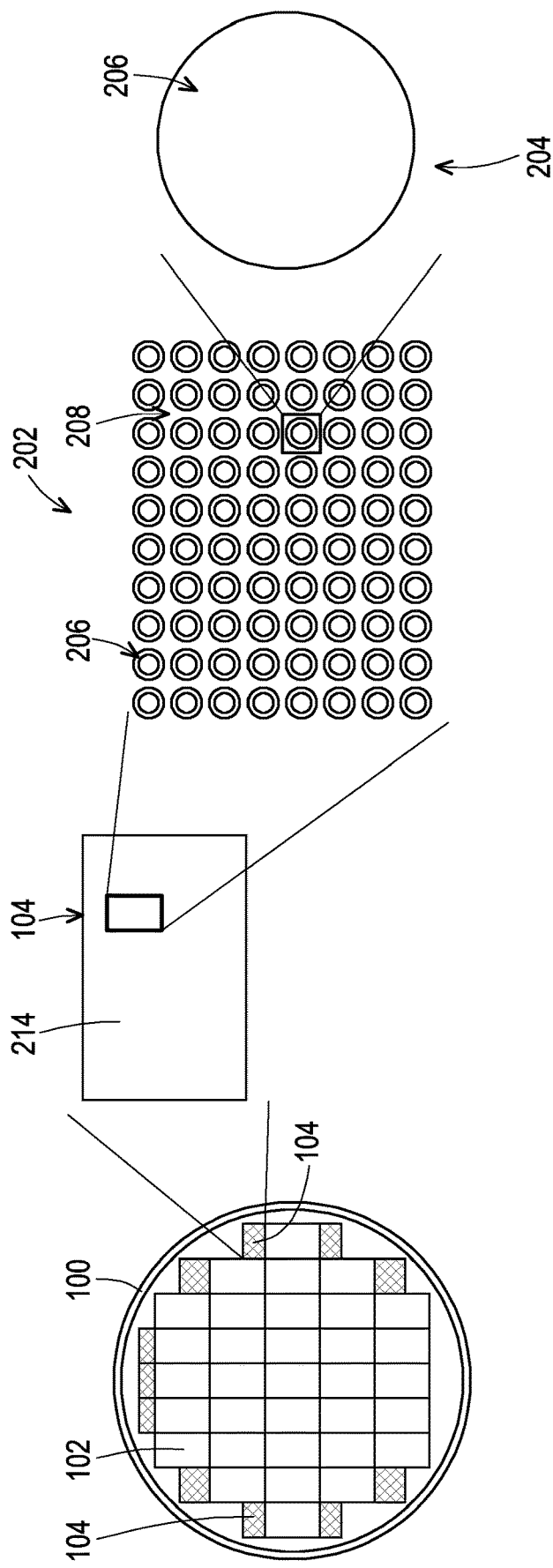
FIG. 2B illustrates a CMUT array of a dummy die of FIG. 1.

FIG. 2B illustrates one exemplary dummy or non-functional die 104 in accordance with one exemplary embodiment. In the embodiment shown in FIG. 2B, the dummy die 104 includes an array 214 of CMUT units 204 substantially the same as that of the array 200 of FIG. 2A, albeit smaller in size than the growth die 102. That is, the dummy die 104 may be implemented as smaller than the size of the growth die 102 in accordance with the size of the growth die 102 and the size of the wafer 100. In some embodiments, the size of the dummy dies 104 are intended to reduce the total bond area (i.e. the ratio of the bonding surface of the wafer to the total surface area of the wafer) is in the range of 55% to 65% of the total wafer surface area. In accordance with a particular embodiment, the dummy die 104 is implemented with an array 214 of cavity only CMUT units 204, i.e., units comprising no electrode and/or membrane, and instead solely comprising a cavity therein. In other embodiments, the dummy die 104 is implemented with an array 214 of nonfunctional CMUT units 204. In accordance with another embodiment, a dummy die 104 positioned/patterned at the edge of the wafer 100 may contain multiple cavities 206 within each die 104. In some embodiments, the total area of the cavities 206 in the growth dies 102 and the dummy dies 104 is in the range of 35% to 45% of the total surface area of the integrated circuit wafer 100. Further, the skilled artisan will appreciate that each growth die 102 may include hundreds or thousands of cavities 206 to form the CMUT array 200 for signal sensing. Accordingly, in such an embodiment, the dummy die 104 may be implemented as a partial patterning of the growth die 102, which has a corresponding partial amount of the cavities 206 in the CMUT array 200 therein.

The formation of the aforementioned CMUT array 200 and/or dummy array 214 may be accomplished in accordance with the various stages of manufacturing presented in FIGS. 3A-3G, discussed below.

Referring now to FIGS. 3A-3F, there are shown cross-sectional views of various stages of a method of manufacturing a semiconductor device 300 that contains the CMUT array 200 and/or dummy array 214 comprising a plurality of CMUT units 204 in accordance with one embodiment. FIG. 3G illustrates the formation of the semiconductor device 100 with CMUT units 204 via the bonding of an integrated circuit substrate 302 to a carrier wafer 332 in accordance with some embodiments.

Figure 3A:
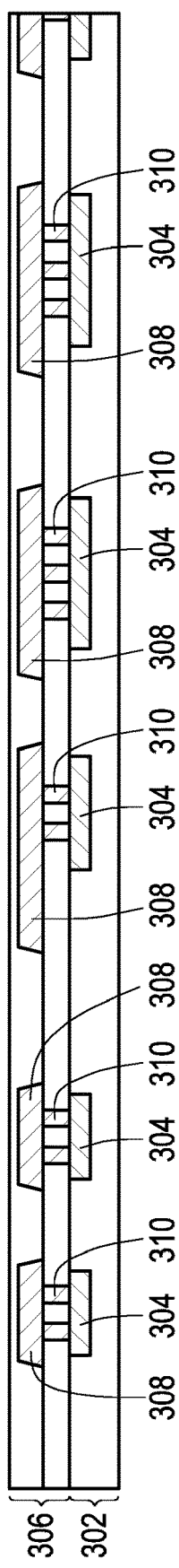
FIGS. 3A-3G illustrate cross-sectional views of some steps for forming a CMUT unit, in accordance with some embodiments.

Turning now to FIG. 3A, an integrated circuit substrate 302 i.e., the integrated circuit wafer 100, having one or more conductive components 304 disposed therein is shown. In accordance with one embodiment, substrate 302 is an integrated circuit substrate, such as a complimentary metal-oxide semiconductor ("CMOS") substrate and the one or more conductive components 304 are components of a CMOS circuit. In such an embodiment, the one or more conductive components 304 correspond to integrated circuit ("IC") components that are disposed on or over the CMOS substrate 302. Suitable examples of such IC components may include, for example and without limitation, active components (e.g., transistors), passive components (e.g., capacitors, inductors, resistors, and the like), or combinations thereof.

The semiconductor device 300 of FIG. 3A further illustrates a plurality of conductive lines or pads 308 disposed within a first dielectric layer 306 formed on the substrate 302. In some embodiments, the conductive pads 308 are implemented as Al—Cu pads. As depicted in FIG. 3A, the plurality of conductive lines or pads 308 are electrically coupled to respective conductive components 304 using one or more first vias 310. In accordance with one embodiment, the first vias 310 and the conductive pads 308 are formed from the same conductive material, i.e., AlCu. In other embodiments, the conductive material may comprise, for example and without limitation, a metal (e.g., titanium, tungsten, silver, gold, aluminum, copper, or alloys thereof), metal nitride, or any suitable combination thereof. In some embodiments, the pads 308 and the first vias 310 may be patterned simultaneously or sequentially. The conductive components 304, and/or conductive lines or pads 308 may be deposited by, for example, chemical vapor deposition (CVD), physical vapor deposition (PVD), atomic layer deposition (ALD), electroless plating, electrochemical plating, sputtering, ion metal plasma, another deposition process, or any suitable combination thereof. In some embodiments, the pads 308 may be exposed through the first dielectric layer 306, e.g., a top surface of the pads 308 is uncovered with respect to the first dielectric layer 306. In other embodiments, the top surface of the pad 308 may be covered by the first dielectric layer 306.

The first dielectric layer 306 may be deposited as a suitable dielectric oxide, as will be appreciated by those skilled in the art. Suitable examples of the first dielectric layer 306 may include, for example and without limitation, an oxide (e.g., $SiO_2$), a nitride (e.g., SiN), an oxy-nitride (e.g., $SiO_XN_Y$), some other dielectric material, or any suitable combination thereof. The first dielectric layer 306 may be deposited, for example and without limitation, by CVD, PVD, ALD, some other deposition process, or any suitable combination thereof. In accordance with one embodiment, the image depicted in FIG. 3A corresponds to redistribution layer formation and passivation processing of the semiconductor device 300, as will be understood by those skilled in the art.

Figure 3B:
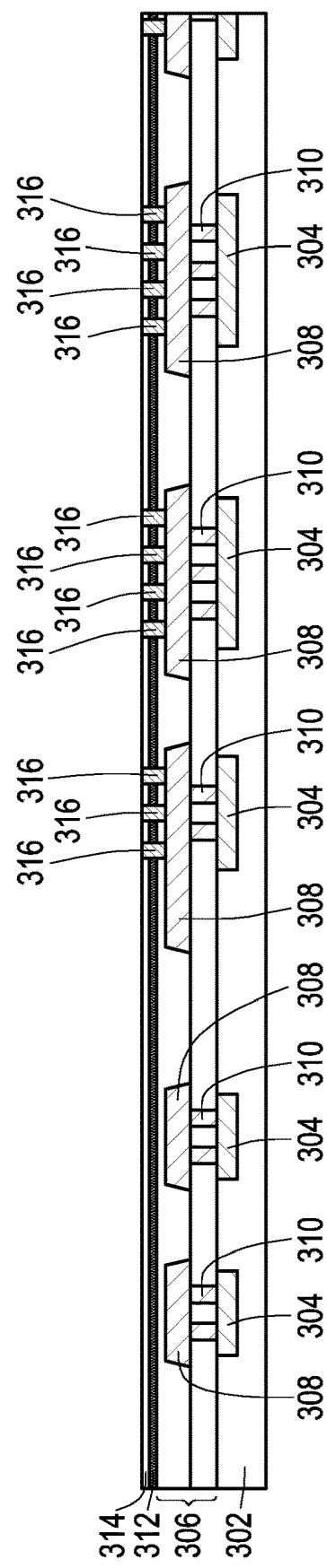

FIG. 3B provides an illustration of the formation of sensing vias 316 during the production of the semiconductor device 300 in accordance with one embodiment. As shown in FIG. 3B, a second dielectric layer 312 and a third dielectric layer 314 are deposited on the semiconductor device 300. In some embodiments, the second dielectric layer 312 comprises a suitable nitride material, such as, for example and without limitation, a silicon nitride material.

The third dielectric layer 314 may comprise, for example and without limitation, an oxide (e.g., $SiO_2$), a nitride (e.g., SiN), an oxy-nitride (e.g., $SiO_XN_Y$), some other dielectric material, or any suitable combination thereof. It will be appreciated that the first, second, and third dielectric layers 306, 312, and 314 may comprise the different dielectric materials, two layers may be the same and the remaining layer different, or the like. The second and third dielectric layers 312 and 314, respectively, may be deposited by, for example and without limitation, CVD, PVD, ALD, some other deposition process, or a suitable combination thereof. In varying embodiments, each layer 312 and 314 may be deposited via different processes, in different process chambers, or using the same deposition process, as will be understood in the art. More generally, at least one bottom dielectric layer 312, 314 is deposited on top of the first dielectric layer 306 and the conductive lines or pads 308.

As shown in FIG. 3B, a plurality of sensing vias 316 are formed in the second and third dielectric layers 312, 314 (or, more generally, the at least one bottom dielectric layer 312, 314), passing into the first dielectric layer 306 contacting the conductive lines/pads 308. Suitable examples of such sensing vias 316 materials include, for example and without limitation, a metal (e.g., Al, Cu, AlCu, Ti, Ag, Au, W, or the like), a metal nitride (e.g., TiN), some other conductive material, or any suitable combination thereof. It will be appreciated that the sensing vias 316 may be deposited by, for example and without limitation, CVD, PVD, ALD, electroless plating, electrochemical plating, sputtering, ion metal plasma, another deposition process, or any suitable combination thereof.

Figure 3C:
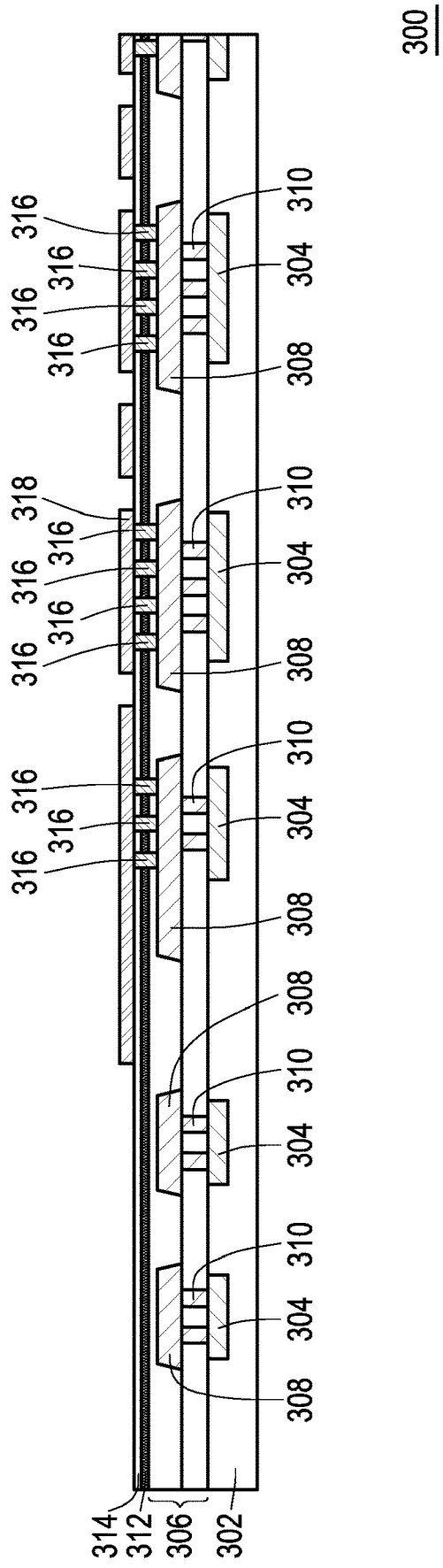

FIG. 3C illustrates the deposition and patterning of a bottom/sensing electrode 318 on the semiconductor device 300 in accordance with one embodiment. In the illustrative embodiment, the at least one sensing electrode 318 is a bottom electrode of a capacitive micromachined ultrasonic transducer unit. As shown in FIG. 3C, the bottom/sensing electrode 318 is patterned prior to the patterning (deposition and etching) of the dielectric films 320-324 (shown in FIG. 3D). The sensing electrode 318 is deposited on top of the at least one bottom dielectric layer 312, 314 (hence referring to the second and third dielectric layers 312, 314 as "bottom" dielectric layers). The sensing electrode 318 is patterned on the third dielectric layer 314 over the sensing vias 316 and in contact therewith. In accordance with varying embodiments contemplated herein, the sensing electrode 318 may comprise, for example and without limitation titanium (Ti) or other metal (e.g., Al, Cu, AlCu, Ag, Au, W, or the like), a metal nitride (e.g., titanium nitride (TiN), another conductive material, or suitable combinations thereof. The bottom/sensing electrode 318 may be deposited by, for example and without limitation, CVD, PVD, ALD, electroless plating, electrochemical plating, sputtering, ion metal plasma, another deposition process, or any suitable combination thereof.

Figure 3D:
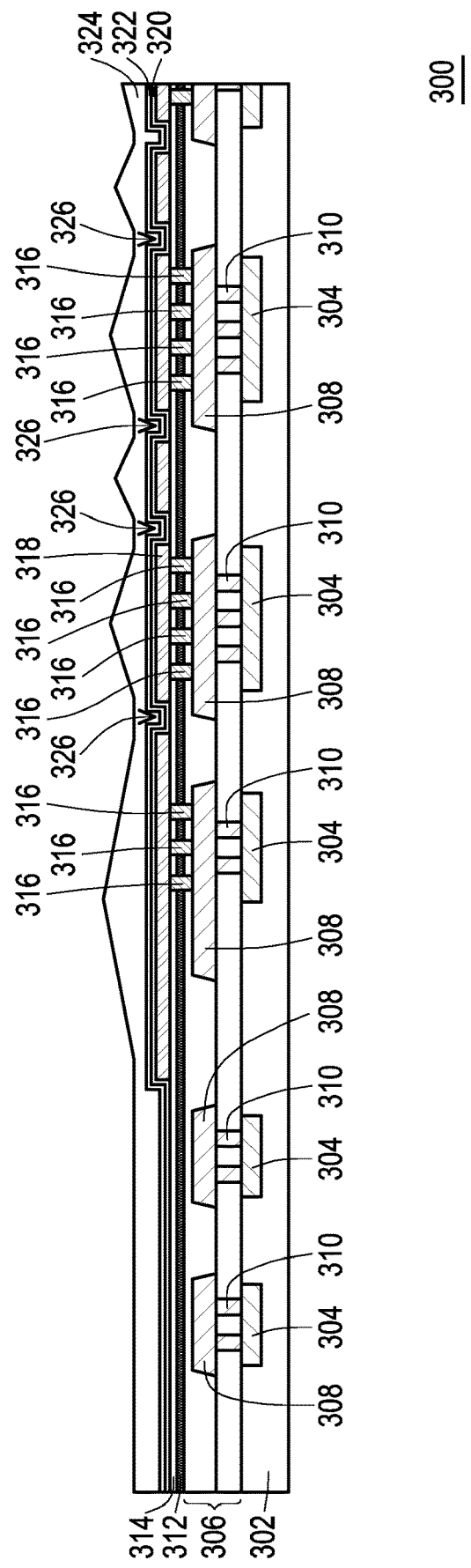

FIG. 3D illustrates the deposition and subsequent patterning of at least one top dielectric film, and in the illustrative embodiment three dielectric films (the dielectric films 320, 322, and 324) which are deposited and patterned after the patterning of the bottom/sensing electrode 318 on the semiconductor device 300 in accordance with one embodiment. The dielectric films 320, 322, 324 are referred to as "top" dielectric layers because they are deposited on top of the bottom/sensing electrode 318. As shown in FIG. 3D, in the illustrative example a fourth dielectric film 320 is deposited on the already patterned bottom/sensing electrode 318. A fifth dielectric layer 322 is then deposited on the fourth dielectric film 320, followed by the deposition of a sixth dielectric film 324 thereupon. It will be appreciated by those skilled in the art that while shown as three separate layers 320-324, the fourth through sixth dielectric layers 320, 322, 324 may be combined into a single layer, into two layers, and the like. Further, it will be appreciated that the composition of the dielectric layers 320, 322, and 324 may be of different materials, or one different and two similar. It will be appreciated by those skilled in the art that the fourth, fifth, and sixth dielectric layers 320, 322, and 324 may be deposited, for example and without limitation, by CVD, PVD, ALD, some other deposition process, or any suitable combination thereof.

In the example embodiment illustrated in FIG. 1D, the fourth dielectric layer 320 comprises an atomic layer deposited oxide material (ALD Ox), the fifth dielectric layer 322 comprises a nitride material (e.g., a SiN material), and the sixth dielectric layer 324 comprises an oxide material (e.g., $SiO_2$). Also illustrated in FIG. 3D are a plurality of isolation trenches 326, located adjacent the bottom/sensing electrodes 318 and filled with the fourth through sixth dielectric layers 320, 322, 324. The skilled artisan will appreciate that isolation trenches 326 provide protection from electric current leakage between the various conductive components, i.e., the bottom/sensing electrodes 318 in accordance with one embodiment contemplated herein.

Figure 3E:
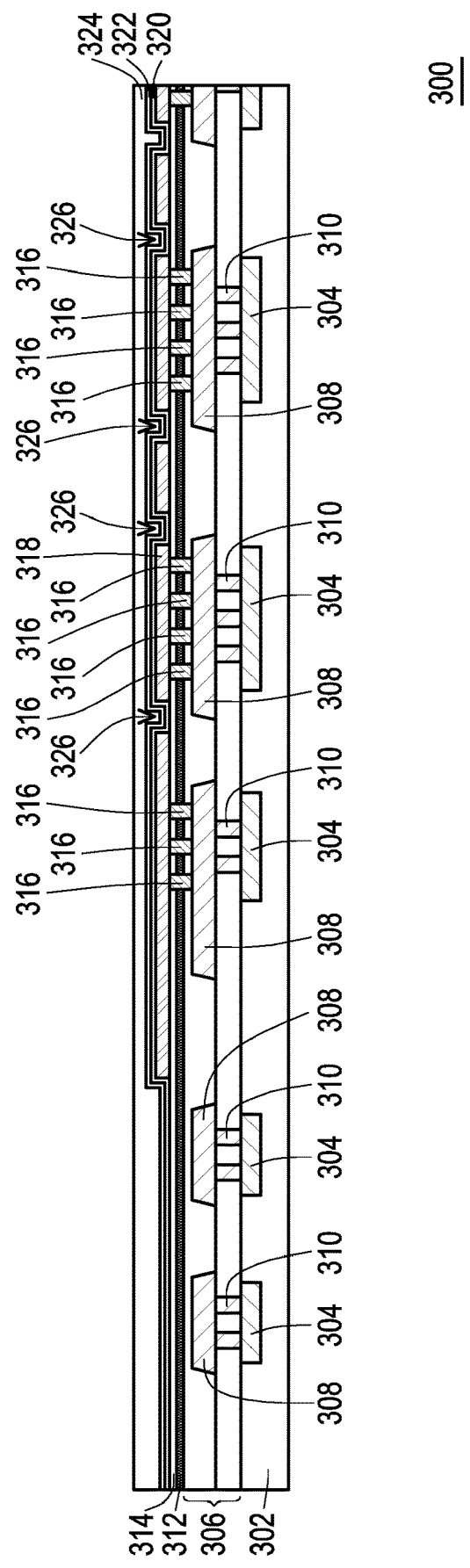

FIG. 3E illustrates the chemical mechanical planarization ("CMP") of the semiconductor device 300 in accordance with one embodiment. As shown in FIG. 3D, the deposition of the sixth dielectric film 324 results in an uneven surface of the semiconductor device 300, denoted particularly by the raised portions above the bottom/sensing electrode 318. As depicted in FIG. 1E, the semiconductor device 300 has been subjected to suitable planarization, i.e., polishing, to remove excess material from the sixth dielectric film 324. The skilled artisan will appreciate that the CMP may be performed to remove a portion of the sixth dielectric film 324 in preparation for additional patterning. The resulting planarization of the semiconductor device 300 from the CMP process is accordingly depicted in FIG. 3E.

Figure 3F:
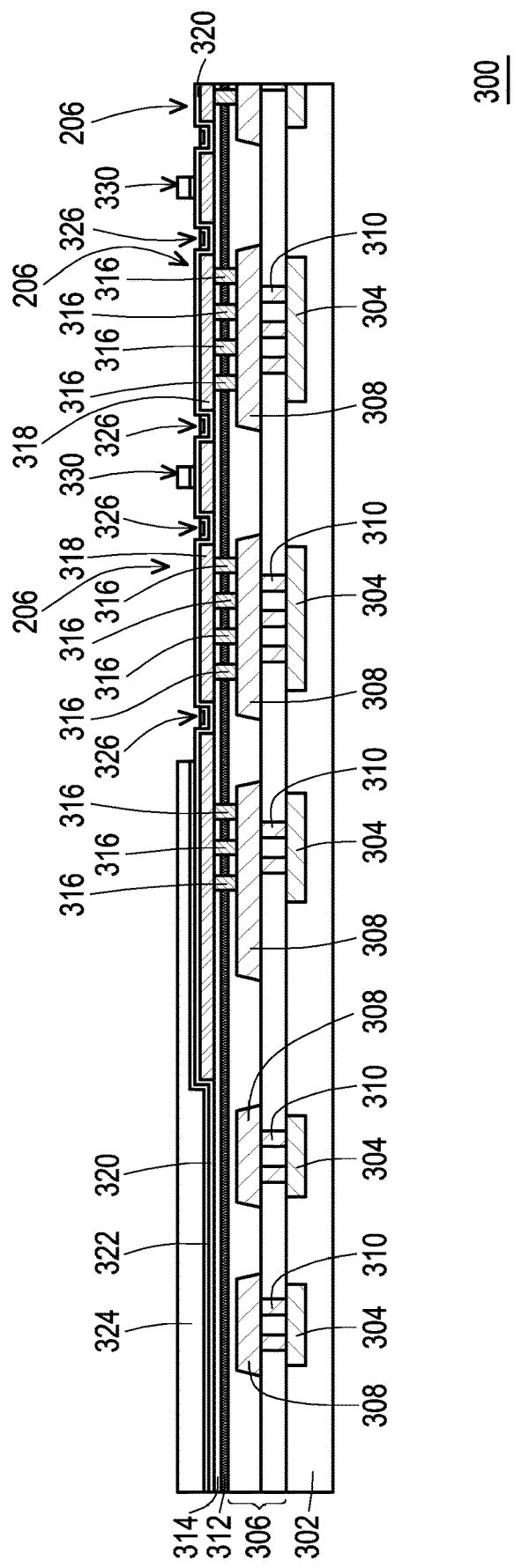
Figure 3G:
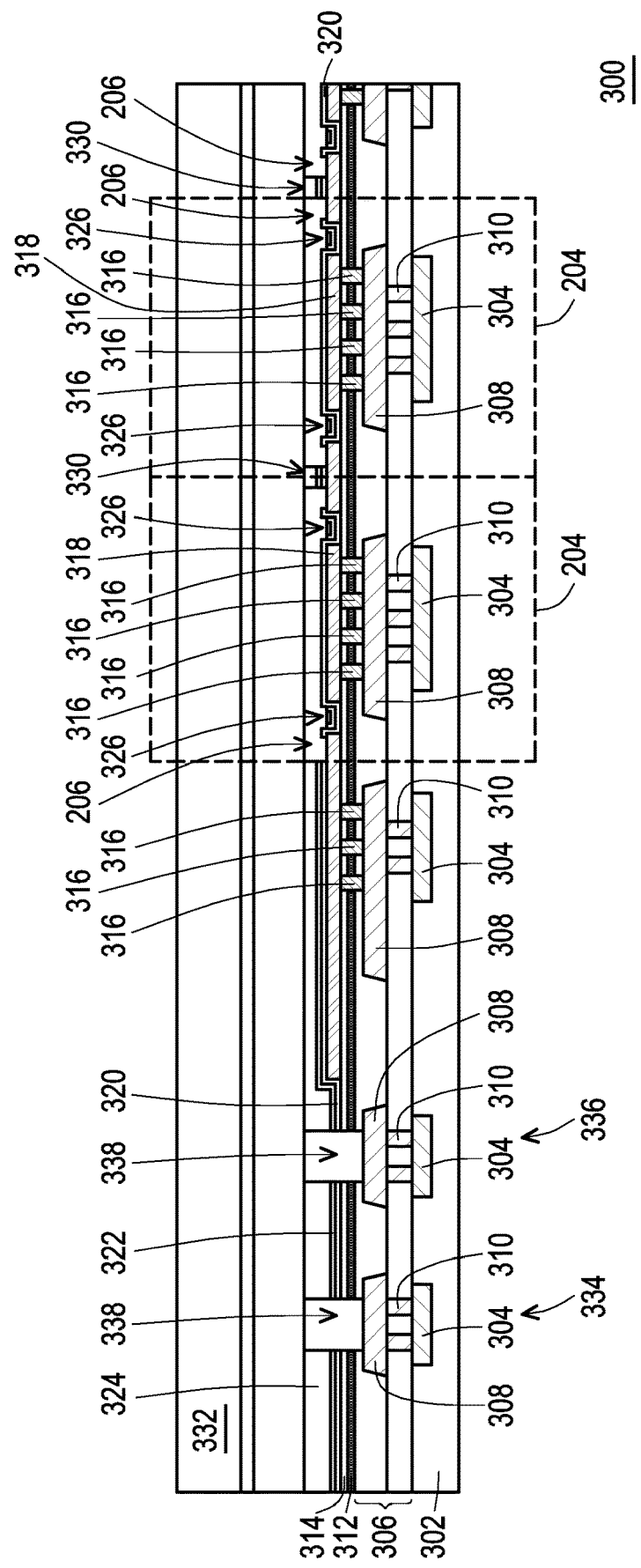

Turning now to FIG. 3F, there is shown an illustration of the additional patterning of one or more cavities 206 on the semiconductor device 300 in accordance with one embodiment. As shown in FIG. 3F, a portion of the fifth dielectric film 322 and the sixth dielectric film 324 deposited in FIG. 3F and subsequently planarized in FIG. 3E is removed (i.e., patterned, etched, etc.) from the semiconductor device 300 to expose the isolation trenches 326 and the fourth dielectric layer 320 covering the bottom/sensing electrode 318. In this manner, a cavity 206 is formed in the fifth and sixth dielectric layers 322, 324 and over the bottom/sensing electrode 318 as shown in FIG. 3F. As indicated above, the cavities 206 may be in non-functional dies 104 or in functioning dies 102, as shown in FIG. 1-2B, above). Furthermore, one or more cavities 206 may be formed in the fifth dielectric film 322 and the sixth dielectric film 324 irrespective of the presence of a bottom/sensing electrode 318, as previously discussed.

Alternatively, in some embodiments, a process for forming the cavities 206 comprises forming a patterned masking layer (not shown) (e.g., positive/negative photoresist, hardmask, etc.) over the sixth dielectric layer 324, over the bottom/sensing electrode 318, and the trenches 326. Thereafter, an etching process is performed to remove unmasked portions of the sixth dielectric layer 324 exposing the fifth dielectric layer 322. The masking layer may be removed and then a second masking layer is patterned to enable removal of a portion of the fifth dielectric layer 322 from a portion of the trenches and above the bottom/sensing electrodes 318, thereby forming the cavities 206. The etching process may be a dry etching process, a RIE process, a wet etching process, some other etching process, or a combination of the foregoing. Subsequently, in some embodiments, the patterned masking layer is stripped away.

Alternatively, in some embodiments, a single masking and etching process may be used, to remove portions of the sixth dielectric layer 324 and fifth dielectric layer 322 over the trenches 326 and bottom/sensing electrodes 318. As illustrated in FIG. 3F, the fourth dielectric layer 320 suitably remains over the bottom/sensing electrodes 318 and lines the isolation trenches 326. Further, a portion of the fifth dielectric layer 322 and the sixth dielectric layer 324 remains in the isolation trenches 326, as more clearly illustrated in FIG. 4, discussed below.

In accordance with one embodiment, a pressure port 330 is positioned between adjacent bottom/sensing electrodes 318 and their respective cavities 206, as will be appreciated by those skilled in the art. In some embodiments, the pressure ports 330 may extend vertically to be in fluid communication with the cavities 206 and may be utilized to control, adjust, create, or otherwise affect pressure inside the cavities 206 after or during the bonding of the semiconductor device 300 with a carrier wafer 332 (i.e., capping wafer or the like), as shown in FIG. 3G.

Turning now to FIG. 3G, there is shown an illustration of a side view of the bonding of the semiconductor device 300 with a corresponding carrier wafer 332 in accordance with one embodiment. As depicted in FIG. 3G, the bonded semiconductor device 300 includes openings 338 located above the conductive components/IC components 304. In some embodiments, the semiconductor device 300 may be bonded to the carrier wafer 332 using a fusion bonding process. The skilled artisan will appreciate that other types of bonding processes may be used to join the semiconductor device 300 with the carrier wafer 332, including for example and without limitation, eutectic bonding.

In the illustration of FIG. 3G, the first conductive/IC component 304 may correspond to a CMOS/MEMS input/output component 334, and the second conductive/IC component 304 may correspond to a CMOS/MEMS interconnect component 336 (e.g., interconnects the various IC components 304 together in a predefined pattern). As shown, the openings 338 may extend from the conductive pads/lines 308 through the first dielectric layer 306, the second dielectric layer 312, the third dielectric layer 314, the fourth dielectric layer 320, the fifth dielectric layer 322, and the sixth dielectric layer 324. It will be appreciated that formation of these openings 338 may be accomplished via etching (dry or wet). That is, the openings 338 may be generated by forming a patterned masking layer (not shown) (e.g., positive/negative photoresist, hardmask, etc.) over the sixth dielectric layer 324. Thereafter, an etching process is performed to remove unmasked portions of the sixth dielectric layer 324, and subsequent dielectric layers 306, 312, 314, 320, and 322 as illustrated in FIG. 3G, thereby forming the openings 338. The aforementioned etching process may be a dry etching process, a RIE process, a wet etching process, some other etching process, or a combination of the foregoing. Subsequently, in some embodiments, the patterned masking layer is stripped away. Also illustrated in FIG. 3G are CMUT units 204, which are illustrated and discussed in greater detail below. It will be appreciated that the semiconductor device 300 includes a plurality of CMUT units 204, and the illustrations provided in FIGS. 3A-3G are intended to shown a portion thereof for example purposes only.

It is noted that for fusion bonding, the surface of the wafer substrate to be bonded should generally be flat and clean. Chemical-mechanical planarization (CMP) may be used to obtain a flat surface on the wafer substrate, and is usually performed prior to a plasma treatment (if utilized). The CMP is illustrated above with respect to FIGS. 3D-3E. In some embodiments, the wafer 100 and/or carrier wafer 332 may be cleaned after the plasma treatment. This cleaning step may be performed, for example, using cleaning solutions containing ammonium hydroxide, hydrogen peroxide, acids such as sulfuric acid or hydrochloric acid, and/or deionized water.

Figure 4:
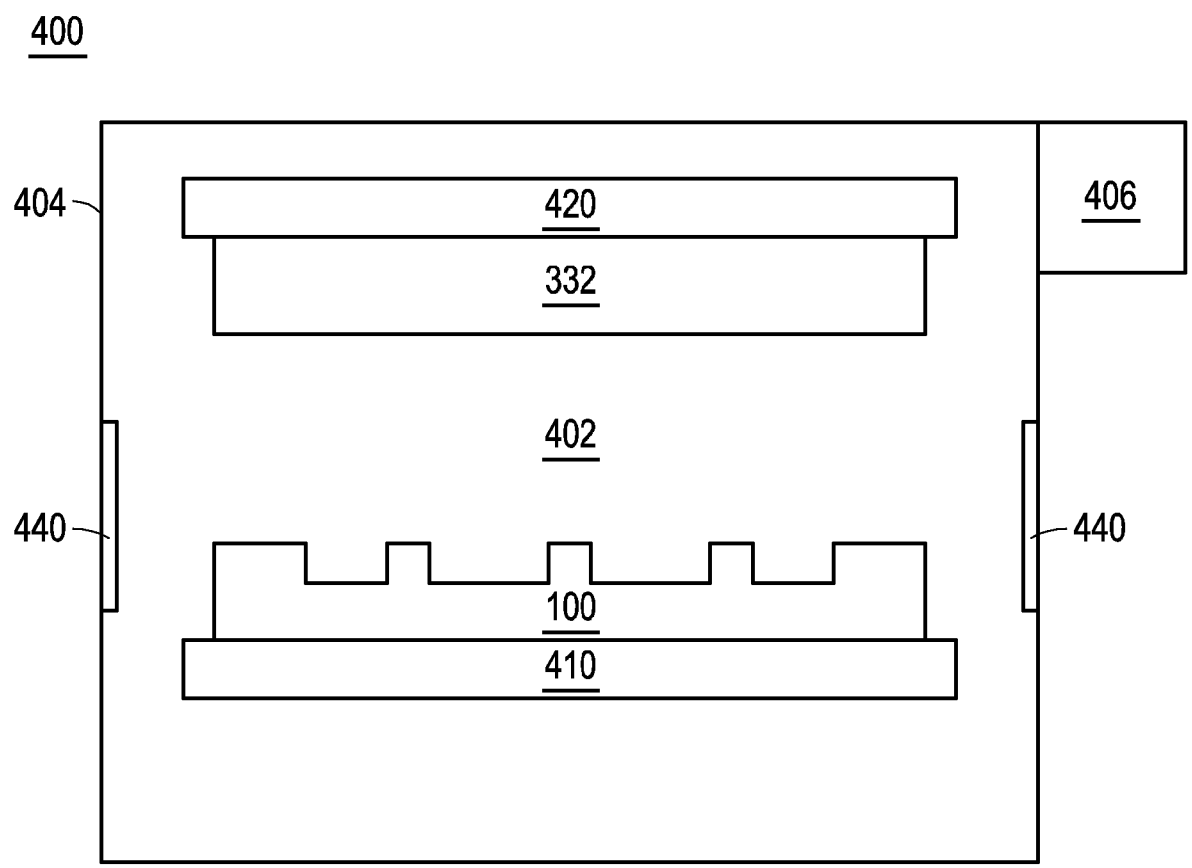
FIG. 4 is a side cross-sectional view illustrating one embodiment of a fusion bonding tool of the present disclosure for practicing the methods of the present disclosure. This figure shows the various components of the fusion bonding tool.

Turning now to FIG. 4, there is shown an illustration of a fusion bonding tool 400 that may be used in one embodiment. The fusion bonding tool 400 includes a wafer bonding chamber 402 within a housing 404. The chamber contains a first wafer support pedestal 410 and a second wafer support pedestal 420 positioned opposite one another. The first wafer support pedestal 410 holds the integrated circuit wafer 100, and the second wafer support pedestal 420 holds the carrier wafer 332. The two wafers 100, 332 face each other. In some embodiments, at least one of the two wafer substrates has undergone plasma treatment, and it is contemplated that both wafer substrates have undergone plasma treatment to activate their surfaces.

According to some embodiments, a controller 406 is used to control the various inputs and outputs, and to measure various conditions within the housing for the fusion bonding process. Different sensors may be present, as different parameters are relevant in the fusion bonding process. For example, such sensors may include those for aligning and tracking the movement of the two wafer support pedestals, for measuring the pressure/pressing force applied during fusion bonding, for measuring and controlling the gas content within the chamber, the temperature and pressure within the chamber, etc. The controller may also include a user interface for communicating with operators.

Figure 5:
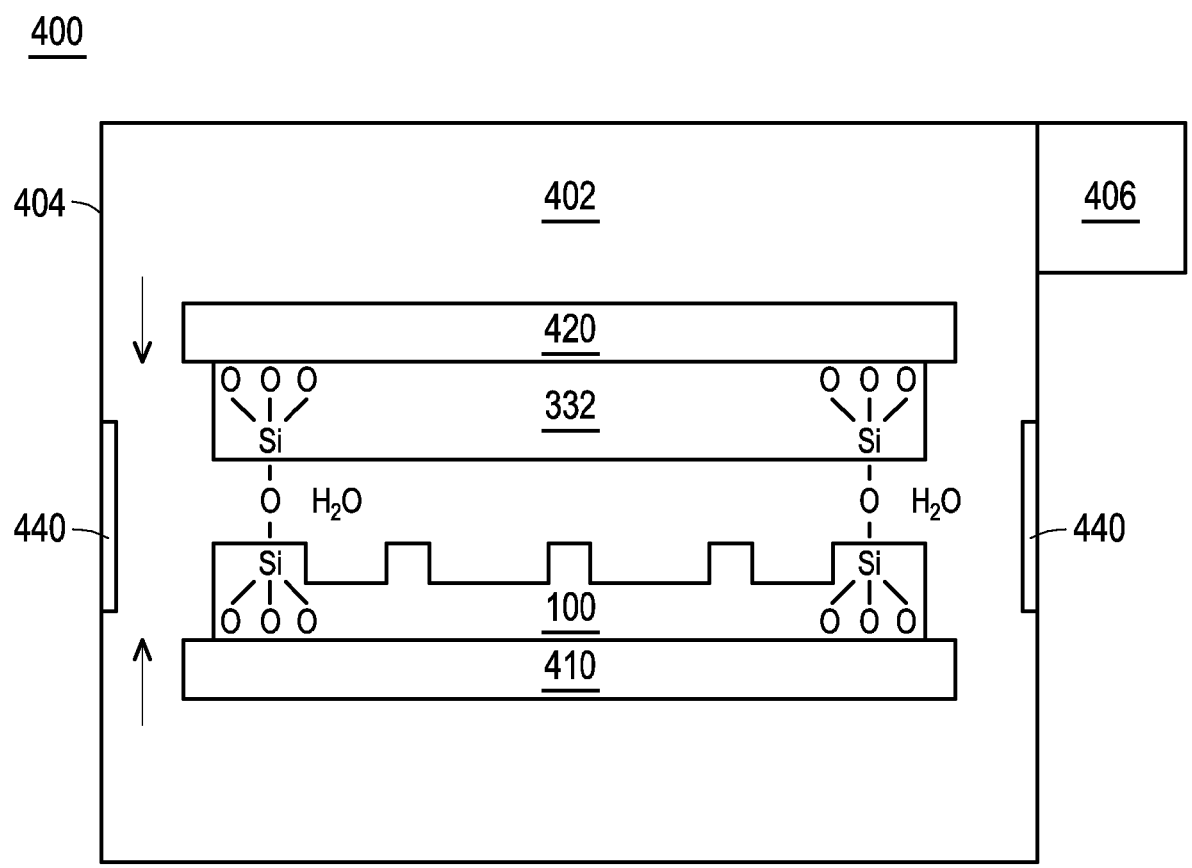
FIG. 5 is a side cross-sectional view showing the fusion bonding tool of FIG. 4 performing a fusion bonding process between two substrates.

Continuing in FIG. 5, the two wafers 100, 332 are aligned and pressed together to cause bonding between their surfaces, without the presence of any intermediate layers. This is usually done by movement of one or both wafer support pedestals 410, 420 towards each other. The pressing force may be any force that accomplishes the task. In some particular embodiments, the pressing force is from about 5 kilonewtons (kN) to about 350 kN. In accordance with one embodiment, the pressure is applied at the starting point 106, as discussed above. As the pressure is applied, beginning at the starting point 106, a bond wave begins to propagate across the wafers 100, 332, as discussed in FIG. 6.

Figure 6:
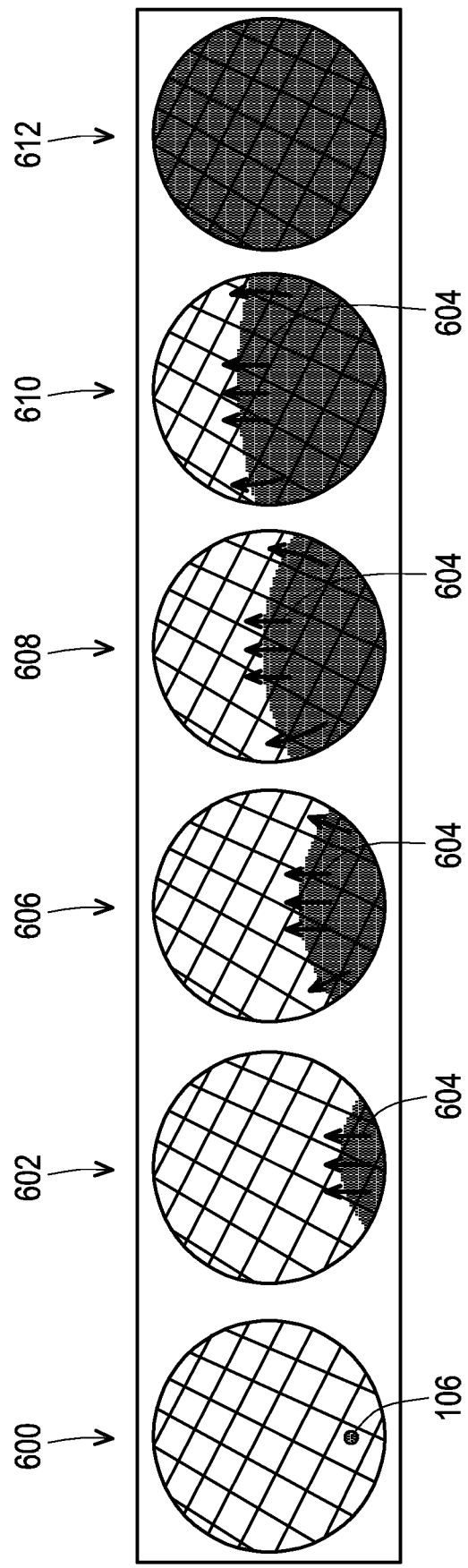
FIG. 6 is an illustrative view of the fusion bonding wave in accordance with the implementation of the growth and dummy dies of the present disclosure.

FIG. 6 illustrates the propagation of a bond wave as the wafer 100 and the carrier wafer 332 are fusion bonded. As illustrated in FIG. 6 (and referring back to FIG. 1), the bonding of the wafers 100 and 332 begins with an application of pressure (i.e., initial contact between the wafers 100 and 332) at the starting point 106 located on an edge of the wafer 100 that does not include any of the dummy dies 104 patterned thereon at 600. At 602, the bond wave 604 begins propagating away from the start point 106 in a substantially even manner. At 606, the utilization of the dummy dies 104, i.e. extra cavities 206 positioned at the outer edges of the wafer 100 maintains the even propagation of the bond wave 604 as it moves across the wafers 100, 332. At 608 and 610, the bond wave 604 continues to propagate at a substantially even rate across the wafers 100, 332, resulting in a bonded structure 612 that does not include trap voids or bubbles.

Initially, the two surfaces bond through van der Waals forces. The two wafer substrates 100, 332 are usually then annealed to strengthen the bond through formation of covalent bonds (indicated with heat source 440). As indicated in FIG. 5, silanol groups will react with each other to form a siloxane bond and a water molecule. The annealing may be performed at a temperature of about 100° C. to about 700° C., as desired, although other temperatures may be used as well. The annealing may be performed at any pressure ranging from vacuum to sub-atmospheric to atmospheric pressure. The annealing may be performed for any time period, for example from about 0.5 hours to about 4 hours. The atmosphere within the fusion bonding chamber can be manipulated as desired, for example using clean dry air (CDA), or a hydrogen ($H_2$) or nitrogen ($N_2$) atmosphere. The water molecules may diffuse away from the surface or outgas into the chamber 402.

Figure 7:
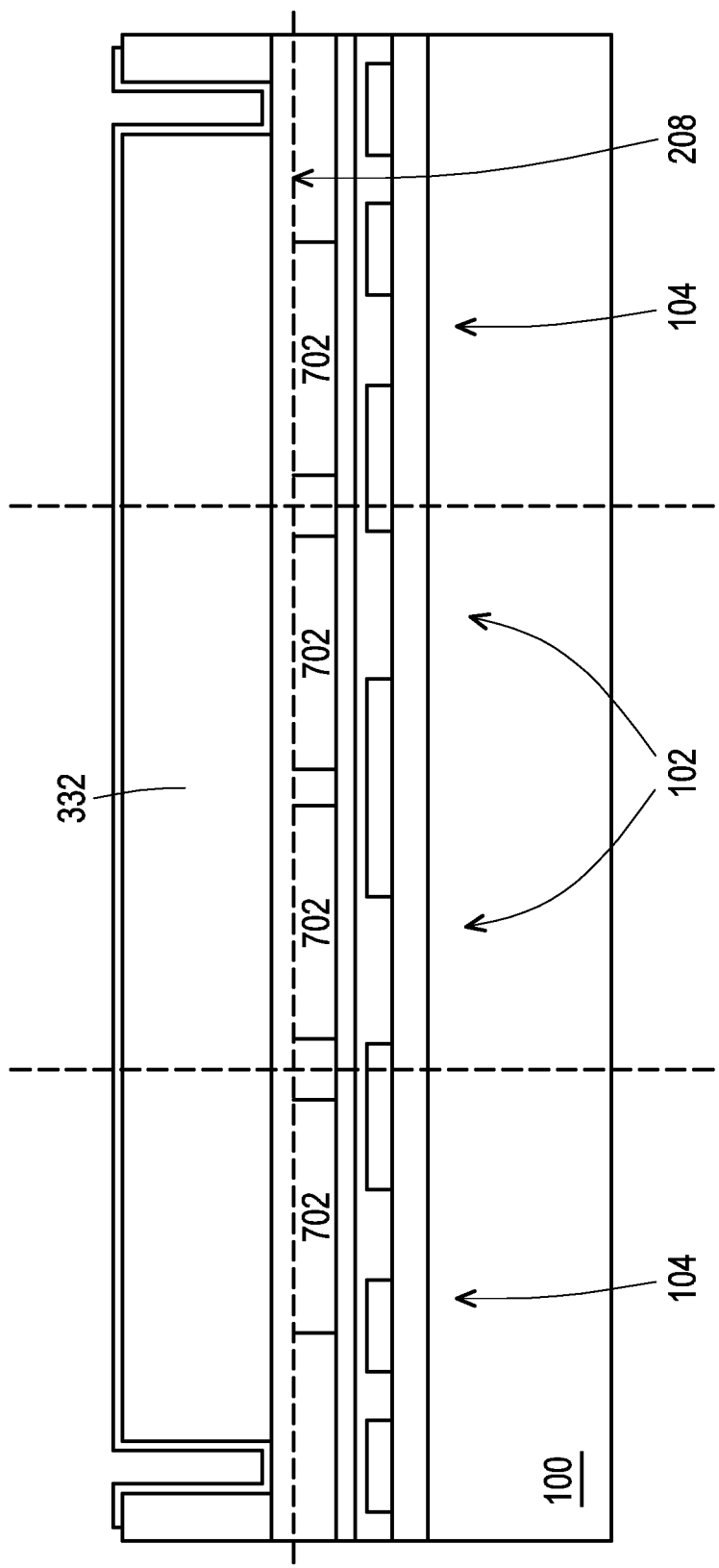
FIG. 7 illustrates a simplified cross-sectional view of growth dies and dummy dies in accordance with some embodiments.

FIG. 7 shows the final combined structure 700 formed from the two wafers 100, 332, with a simplified view of dummy dies 104 and growth dies 102 depicted therebetween. As shown in FIG. 7, the simplified cross-section of the wafer 100 includes a first dummy die 104, a plurality of growth dies 102, and a second dummy die 104. It will be appreciated that the view of FIG. 7 is intended as an illustration of the location of the dummy dies 104 and growth dies 102 from an edge of the bonded wafers 100 and 332. FIG. 7 further depicts a plurality of cavities 702, each cavity 702 being representative of a CMUT array 200 or 214, thus illustrating the aforementioned reduction in bonding surface area enabling the avoidance of trap voids and/or bubbles that may occur during the bonding process.

The fusion-bonded surface 208 is indicated as a dotted line, with the cavities 702 being hermetically sealed between the bonded wafers 100 and 332. It will be appreciated that the final structure 700, utilizing the dummy dies 104 along a portion of the edge of the wafer 100 has produced a substantially reduced bonded surface area between the wafer 100 and the carrier wafer 332. The final structure 700 may be further processed if desired. As one example of further processing, the thickness of the capping wafer may be reduced though CMP or some other process. For example, the capping wafer may have a starting thickness in FIG. 4 of several hundred micrometers, which is then reduced to a thickness of less than 100 micrometers in FIG. 7. As another example of further processing, the final structure can be cleaned again or undergo testing/certification processes.

Figure 8:
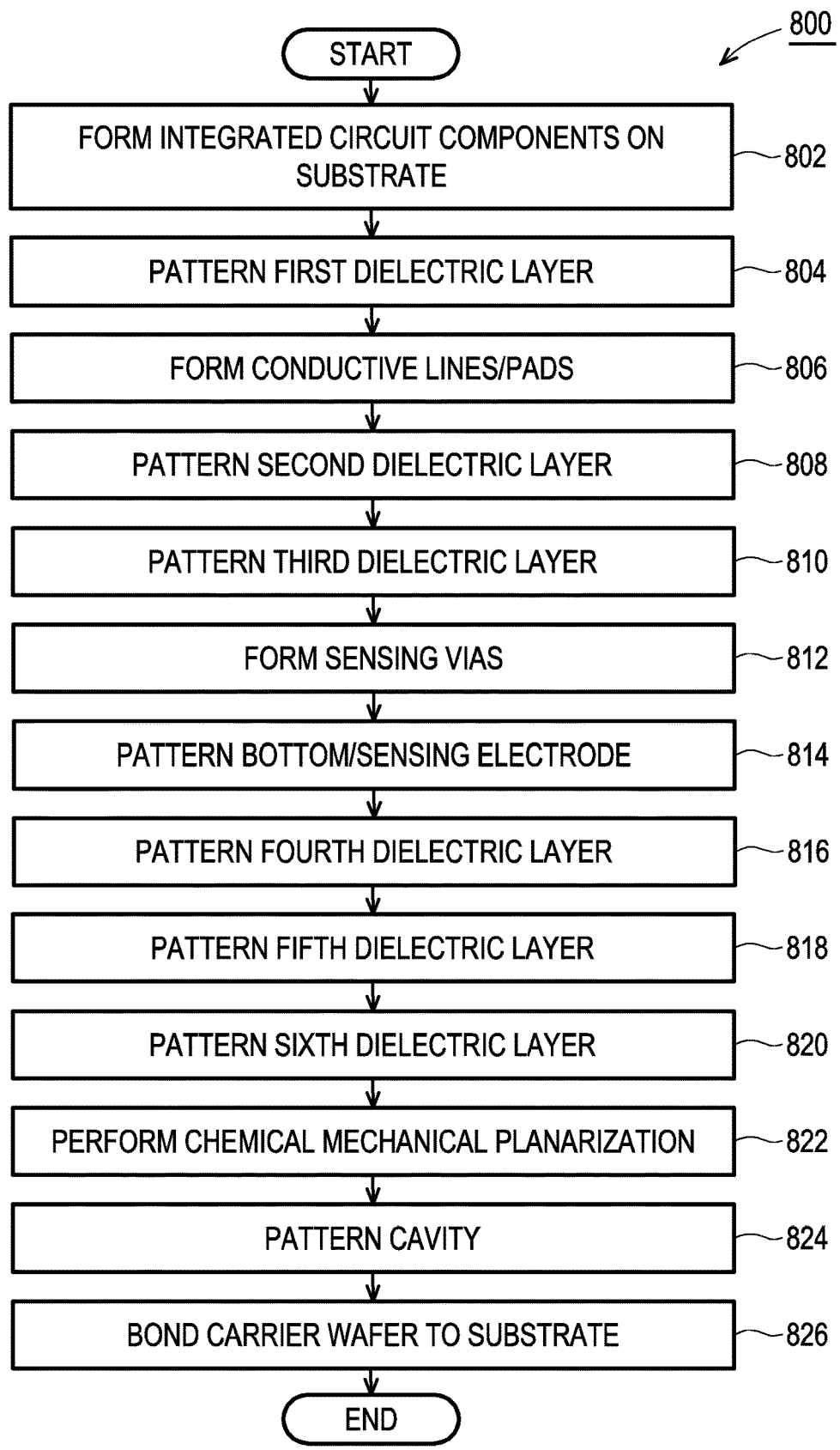
FIG. 8 illustrates a method for improving the fusion bond quality between two wafers in accordance with some embodiments.

Turning now to FIG. 8, there is shown a flow chart illustrating a method 800 for forming a fusion bond wave optimized semiconductor device in accordance with one embodiment. The various steps are also illustrated in FIGS. 3A-3G.

The method 800 begins at step 802, whereupon one or more integrated circuit components 304 are formed on a CMOS substrate 302. It will be appreciated by those skilled in the art that the integrated circuit components 304 may be or comprise, for example and without, active electronic devices (e.g., transistors), passive electronic devices (e.g., resistors, capacitors, inductors, fuses, etc.), some other electronic devices, or a combination thereof. Formation of these integrated circuit components 304 may be accomplished in accordance with suitable deposition, etching, etc., processes as will be appreciated by those skilled in the art.

At step 804, a first dielectric layer 306 is formed on the substrate 302. In some embodiments, the first dielectric layer 306 may be a dielectric oxide (e.g., $SiO_2$), a nitride (e.g., SiN), an oxy-nitride (e.g., $SiO_XN_Y$), some other dielectric material, or any suitable combination thereof. The first dielectric layer 306 may be deposited, for example and without limitation, by CVD, PVD, ALD, some other deposition process, or any suitable combination thereof.

At step 806, a plurality of conductive lines or pads 308 and first vias 310 are formed on the substrate 302. In accordance with one embodiment, the first vias 310 and the conductive pads 308 are formed from the same conductive material, i.e., AlCu. In other embodiments, the conductive material may comprise, for example and without limitation, a metal (e.g., titanium, tungsten, silver, gold, aluminum, copper, or alloys thereof), metal nitride, or any suitable combination thereof. In some embodiments, the pads 308 and the first vias 310 may be patterned simultaneously or sequentially. The conductive components 304, and/or conductive lines or pads 308 may be deposited by, for example, CVD, PVD, ALD, electroless plating, electrochemical plating, sputtering, ion metal plasma, another deposition process, or any suitable combination thereof. The result of these three steps is illustrated in FIG. 3A.

At step 808, a second dielectric layer 312 is deposited on the first dielectric layer 306. In some embodiments, the second dielectric layer 312 comprises a suitable nitride material, such as, for example and without limitation, a silicon nitride material.

At step 810, a third dielectric layer 314 is deposited on the second dielectric layer 312. The third dielectric layer 314 may comprise, for example and without limitation, an oxide (e.g., $SiO_2$), a nitride (e.g., SiN), an oxy-nitride (e.g., $SiO_XN_Y$), some other dielectric material, or any suitable combination thereof.

At step 812, a plurality of sensing vias 316 are formed on the conductive lines/pads 308, through the second and third dielectric layers 312, 314. In some embodiments, a patterned masking layer (e.g., positive/negative photoresist, hardmask, etc.) may be layered over the third dielectric layer 314. In further embodiments, the patterned masking layer may be formed by forming a masking layer on the third dielectric layer 314, exposing the masking layer to a pattern (e.g., via a lithography process, such as photolithography, extreme ultraviolet lithography, or the like), and developing the masking layer to form the patterned masking layer. Thereafter, an etching process is performed to remove unmasked portions of the third dielectric layer 314 and the second dielectric layer 312, thereby forming openings therethrough over the conductive pads/lines 308. The aforementioned etching process may be a dry etching process, a wet etching process, a reactive ion etching (RIE) process, some other etching process, or a combination of the foregoing. The sensing vias 316 may then be deposited via any suitable means and the aforementioned patterned masking layer is stripped away.

In accordance with another embodiment, steps 808, 810, 812 may be performed in an alternate manner, wherein the material for the sensing vias 316 is deposited first, then a patterning mask is formed protecting the desired sensing vias 316, followed by etching to remove the undesired sensing via material. Thereafter, deposition of the second and third dielectric layers 312, 314, may be performed as discussed above. The photoresist protecting the sensing vias 316 is then removed resulting in the image provided in FIG. 3B.

After formation of the sensing vias 316, operations proceed to step 814, whereupon bottom/sensing electrodes 318 are patterned on the second dielectric layer 314 and in contact with the sensing vias 316. That is, a patterned masking layer (i.e., positive/negative photoresist, hardmask, etc.) is formed over the third dielectric layer 314. The bottom/sensing electrodes 318 are then deposited via photoresist or other masking component is deposited by, for example and without limitation, CVD, PVD, ALD, electroless plating, electrochemical plating, sputtering, ion metal plasma, another deposition process, or any suitable combination thereof. According to one embodiment, the bottom/sensing electrode 318 may comprise titanium deposited via ion metal plasma deposition at a thickness in the range of 80 to 110 angstroms. According to another embodiment, the bottom/sensing electrode 318 may comprise titanium deposited via sputtering deposition at a thickness in the range of 15 to 40 angstroms. In other embodiments, the bottom/sensing electrode 318 may comprise, for example and without limitation, Al, Cu, AlCu, Ag, Au, W, or the like, a metal nitride (e.g., TiN), or other conductive material. Subsequently, in some embodiments, the patterned masking layer is stripped away, resulting in the patterned first bottom/sensing electrodes 118 as illustrated in FIG. 3C.

At step 816, a fourth dielectric layer 320 is deposited on the third dielectric layer 314 and bottom/sensing electrodes 318. In accordance with one embodiment, the fourth dielectric layer 320 comprises an oxide material that is deposited via atomic layered deposition (ALD).

A fifth dielectric layer 322 is then deposited over the fourth dielectric layer 320 at step 818. In accordance with one exemplary embodiment, the fifth dielectric layer 322 comprises a nitride material, e.g., a SiN material, or the like.

Thereafter, a sixth dielectric layer 324 is deposited on the fifth dielectric layer 322 at step 820. According to one exemplary embodiment, the sixth dielectric layer 324 comprises an oxide material, e.g., SiO2 or the like. FIG. 3D provides an illustrative example of the semiconductor device 300 after completion of steps 816, 818, and 820.

Operations for the fabrication of the semiconductor device 300 then proceed to step 822, whereupon chemical mechanical planarization (CMP) is performed so as to remove excess portions of the sixth dielectric layer 324, as illustrated in FIG. 3E.

At step 824, cavities 206 are formed over the bottom/sensing electrodes 318 and isolation trenches 326. That is, a patterned masking layer (e.g., positive/negative photoresist, hardmask, etc.) may be formed over the sixth dielectric layer 324, leaving exposed the sixth dielectric layer 324 over the bottom/sensing electrodes 318 and the trenches 326. In some embodiments, the patterned masking layer may also be formed in areas in which no bottom electrodes 318 are located, i.e. for dummy dies 104 that do not include the aforementioned electrodes 318. Thereafter, an etching process is performed to remove portions of the unmasked sixth dielectric layer 324 and the fifth dielectric layer 322, thereby forming the cavities 206 and exposing the trenches 326. The etching process may be a dry etching process, a RIE process, a wet etching process, some other etching process, or a combination of the foregoing. Thereafter, the patterned masking layer is stripped away. The result is shown in FIG. 3F.

In some embodiments, a second masking and etching process may be used, i.e., when the fifth dielectric layer 322 remains after the first masking/etching process to remove portions of the sixth dielectric layer 324 over the trenches 326 and bottom/sensing electrodes 318. As illustrated in FIG. 3F-3G, the fourth dielectric layer 320 suitably remains over the bottom/sensing electrodes 318 and lines the isolation trenches 326, and a portion of the fifth dielectric layer 320 and a portion of the sixth dielectric layer 324 remain in the isolation trenches 326, as illustrated in FIG. 3F-3G. Accordingly, the skilled artisan will appreciate that one or more masks and etching processes may be used to form the cavities 206 of the semiconductor device 300.

It will further be appreciated that the thickness of the fourth dielectric layer 320 lining the bottom/electrode 318 wall 344 is dependent upon the aforementioned surface roughness of the bottom/electrode 318. Thus, for example and without limitation, when the bottom/sensing electrode 318 comprises titanium that is deposited via ion metal plasma, the fourth dielectric film 320 may have a thickness L in the range of 150 to 300 angstroms, and may be greater than 200 angstroms thick. In another example, using titanium as the bottom/sensing electrode 318 deposited via sputtering, the fourth dielectric film 320 may have a thickness L in the range of 50 to 80 angstroms, and may be greater than 60 angstroms thick.

In accordance with some embodiments disclosed herein, one or more pressure ports 330 positioned between adjacent bottom/sensing electrodes 318 and their respective cavities 206, may be patterned/formed at 824 or subsequent thereto. In such embodiments, the pressure ports 330 may extend vertically to be in fluid communication with the cavities 206 and may be utilized to control, adjust, create, or otherwise affect pressure inside the cavities 206 after or during the bonding of the integrated circuit substrate 302 with a carrier wafer 332 (i.e., capping wafer or the like), as shown in FIG. 3G.

At step 826, the semiconductor device 300 comprising a plurality of CMUT units 204 is formed by bonding of the integrated circuit substrate 302 to a carrier wafer 332. In some embodiments, the integrated circuit wafer 100 may be bonded to the carrier wafer 132 using a fusion bonding process, as discussed above with respect to FIGS. 4-7. The result is shown in FIG. 3G.

Figure 9:
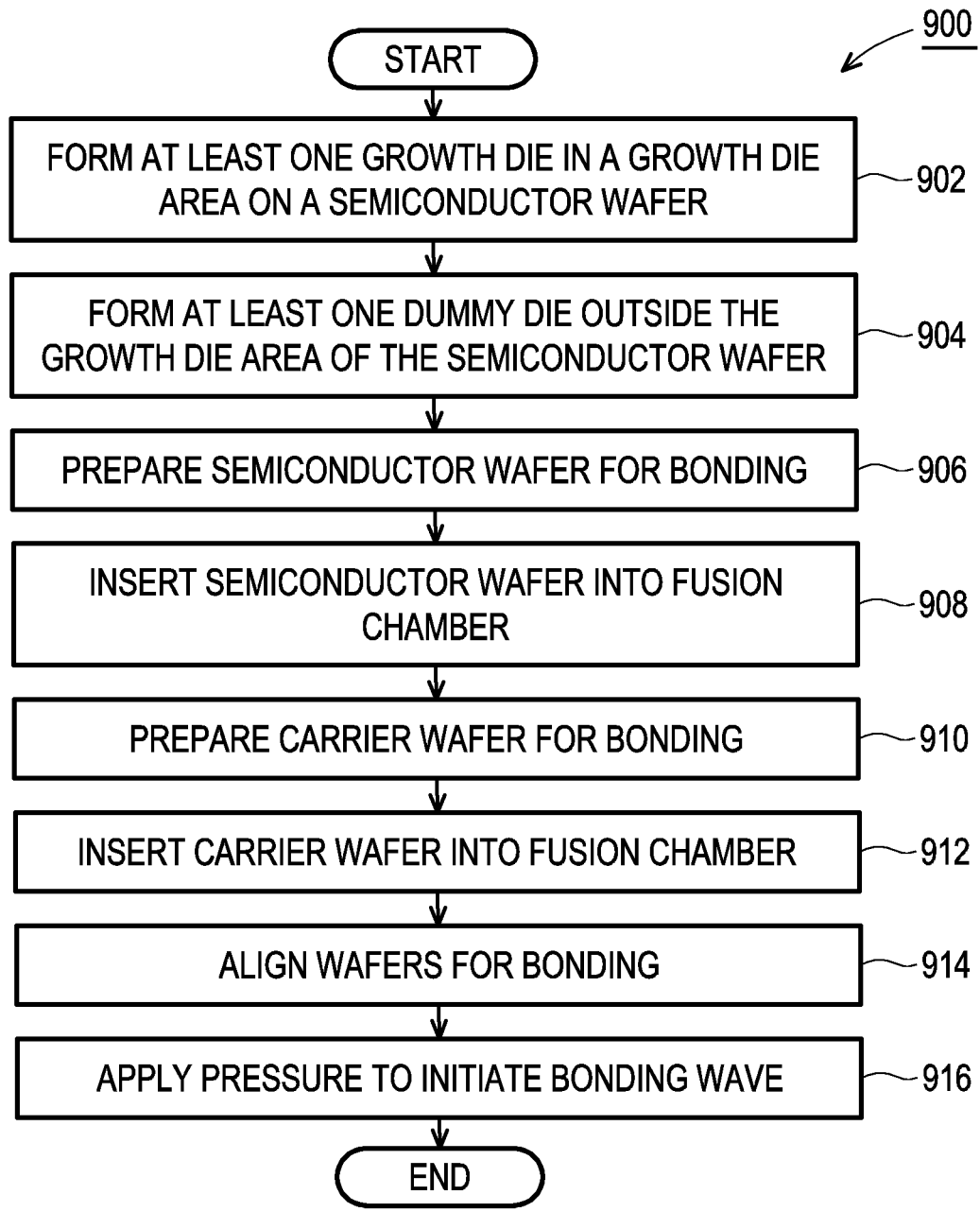
FIG. 9 illustrates a method for bond wave optimization in accordance with some embodiments.

Turning now to FIG. 9, there is shown a flow chart illustrating a method 900 for optimizing bond wave uniformity in fusion bonding in accordance with one embodiment. The method begins at step 902, whereupon at least one growth die 102 is formed in a growth die area 108 on a surface 110 of an integrated circuit wafer 100. This formation of the growth die 102 further includes patterned etching to define at least one cavity 206 in each growth die 102. In some embodiments, the growth die 102 comprises a CMUT array 200 of CMUT units 204, each unit including a corresponding cavity 206 associated therewith. At step 904, at least one dummy die 104 is formed outside the growth area 108 on the surface 110 of the wafer 100. This formation of the dummy die 104 further includes the performance of patterned etching to define at least one cavity 206 in each dummy die 104. In some embodiments, the at least one dummy die 104 is less than the size of the growth die 102. In other embodiments, the dummy die 104 includes a CMUT array 214 of CMUT units 204, each of which includes a cavity 206 associated therewith. In still other embodiments, the CMUT array 214 of the dummy die 104 includes only a cavity 206 therein, i.e. no underlying functional components (e.g. electrode 212, membrane 210, etc.) and is thus different in structure from the growth die 102. According to one embodiment, the at least one dummy die 104 is patterned along a portion of the circumference of the wafer 100, adjacent to one or more growth dies 102. In some embodiments, the size of the dummy dies 104 are intended to reduce the total bond area (i.e. the ratio of the bonding surface of the wafer to the total surface area of the wafer) to less than 65% of the total wafer surface area.

At step 906, the integrated circuit wafer 100 is prepared for fusion bonding, as discussed above with respect to FIGS. 4-7. At step 908, the wafer 100 is inserted into the chamber 402 of a fusion bonding tool 400 and placed on the first wafer support pedestal 410. At step 910, a carrier wafer 332 is prepared for fusion bonding. The carrier wafer 332 is then placed on the second wafer support pedestal 420 of the fusion bonding tool 400 at step 912. At step 914, the two wafers 100 and 332 are aligned for joining. At step 916, pressure is applied at a start point 106 to generate a bond wave initiated at the start point 106 and propagating across the surface 110 of the wafer 100. The bond wave 504 then propagates substantially evenly across the wafers 100 and 332 to fusion bond the two wafers together, as illustrated in FIGS. 4-7. It will be appreciated that after successful bonding and any other post processing steps (not shown), the bonded wafers 100, 332 may be diced or separated into individual components inclusive of the growth dies 102, with the dummy dies 104 discarded.

In accordance with a first embodiment, there is provided a method of manufacturing a semiconductor device. The method includes forming, in a growth die area on a surface of an integrated circuit wafer, at least one growth die including performing patterned etching to define at least one cavity in each growth die. The method further includes forming, outside the growth die area on the surface of the integrated circuit wafer, at least one dummy die including performing patterned etching to define at least one cavity in each dummy die. In addition, the method includes fusion bonding a carrier wafer to the surface of the integrated circuit wafer wherein the fusion bonding initiates at a starting point on the surface of the integrated circuit wafer and propagates as a bond wave across the surface of the integrated circuit wafer.

In accordance with a second embodiment, there is provided a semiconductor device that includes a carrier wafer and an integrated circuit wafer bonded to the carrier wafer. The integrated circuit wafer includes at least one growth die patterned and etched therein in a growth die area of the integrated circuit wafer. The wafer further includes at least one dummy die patterned and etched therein and located between the growth area and an edge of the circumference of the integrated circuit wafer.

In accordance with a third embodiment, there is provided a method of manufacturing a semiconductor device. The method includes forming, in a growth die area on a surface of an integrated circuit wafer, a plurality of growth dies. Each of the growth dies includes an array of capacitive micromachined ultrasonic transducer (CMUT) units wherein each CMUT unit include a bottom sensing electrode and an etched cavity. The method further includes forming, on the surface of an integrated circuit wafer and in an area between the growth die area and a circumference of the integrated circuit wafer, a plurality of dummy dies each including an array of etched cavities. Additionally, the method includes fusion bonding a carrier wafer to the surface of the integrated circuit wafer. The fusion bonding is initiated at a starting point on the surface of the integrated circuit wafer and propagates as a bond wave across the surface of the integrated circuit wafer. This fusion bonding does not occur at the etched cavities of the CMUT units and does not occur at the etched cavities of the dummy dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming, in a growth die area on a surface of an integrated circuit wafer, at least one growth die including performing patterned etching to define at least one cavity in each growth die; and
    forming, outside the growth die area on the surface of the integrated circuit wafer, at least one dummy die including performing patterned etching to define at least one cavity in each dummy die.

2. The method of claim 1, wherein a total area of the cavities in the growth and dummy dies is in the range of 35% to 45% of the area of the surface of the integrated circuit wafer.

3. The method of claim 1, further comprising fusion bonding a carrier wafer to a surface of the integrated circuit wafer, wherein the fusion bonding initiates at a starting point on the surface of the integrated circuit wafer and propagates as a bond wave across the surface of the integrated circuit wafer, and wherein a bonded surface area between the integrated circuit wafer and the carrier wafer is in the range of 55% to 65% of the area of the surface of the integrated circuit wafer.

4. The method of claim 1, wherein each growth die comprises an array of capacitive micromachined ultrasonic transducer units.

5. The method of claim 1, wherein a size of the at least one dummy die is less than a size of the growth die.

6. The method of claim 1, wherein the at least one growth die comprises an array of capacitive micromachined ultrasonic transducer units.

7. The method of claim 1, wherein the at least one dummy die comprises an array of nonfunctional capacitive micromachined ultrasonic transducer units.

8. The method of claim 1, wherein:
    the forming of the at least one growth die further includes forming bottom sensing electrodes of an array of capacitive micromachined ultrasonic transducer units; and
    the forming of the at least one dummy die does not include forming bottom sensing electrodes of an array of capacitive micromachined ultrasonic transducer units.

9. A semiconductor device, comprising:
    an integrated circuit wafer comprising:
    at least one growth die formed in a growth die area of the integrated circuit wafer, and
    at least one dummy die including a cavity patterned and etched therein and located between the growth die area and an edge of the circumference of the integrated circuit wafer.

10. The semiconductor device of claim 9, wherein at least one of the at least one growth die pattern or the at least one dummy die pattern comprises an array of capacitive micromachined ultrasonic transducers.

11. The semiconductor device of claim 9, wherein a size of the at least one dummy die is less than a size of the growth die.

12. The semiconductor device of claim 11, further comprising a carrier wafer bonded to the integrated circuit wafer, wherein the bonded surface area between the integrated circuit wafer and the carrier wafer is in the range of 55% to 65% of the area of the surface of the integrated circuit wafer.

13. The semiconductor device of claim 9, wherein the at least one growth die includes at least one cavity.

14. The semiconductor device of claim 13, wherein a total area of the cavities in the at least one growth die and the at least one dummy die is in the range of 35% to 45% of the area of the surface of the integrated circuit wafer.

15. A method of manufacturing a semiconductor device, comprising:
    forming, in a growth die area on a surface of an integrated circuit wafer, a plurality of growth dies each including an array of capacitive micromachined ultrasonic transducer (CMUT) units;
    forming a plurality of dummy dies on the surface of an integrated circuit wafer and in an area between the growth die area and a circumference of the integrated circuit wafer; and
    fusion bonding a carrier wafer to the surface of the integrated circuit wafer wherein the fusion bonding initiates at a starting point on the surface of the integrated circuit wafer and propagates as a bond wave across the surface of the integrated circuit wafer.

16. The method of claim 15, wherein a total area of the cavities in the growth and dummy dies is in the range of 35% to 45% of the area of the surface of the integrated circuit wafer.

17. The method of claim 15, wherein the bonded surface area between the integrated circuit wafer and the carrier wafer is in the range of 55% to 65% of the area of the surface of the integrated circuit wafer.

18. The method of claim 15, wherein a size of at least one of the plurality of dummy dies is less than a size of a growth die.

19. The method of claim 15, wherein the starting point is located on the surface of the integrated circuit wafer that does not include the plurality of dummy dies.

20. The method of claim 15, wherein the at least one dummy die comprises an array of nonfunctional capacitive micromachined ultrasonic transducer units.

* * * * *